United States Patent
Delacruz et al.

(10) Patent No.: US 10,283,445 B2
(45) Date of Patent: May 7, 2019

(54) BONDING OF LAMINATES WITH ELECTRICAL INTERCONNECTS

(71) Applicant: Invensas Corporation, San Jose, CA (US)

(72) Inventors: Javier A. Delacruz, Santa Clara, CA (US); Belgacem Haba, Saratoga, CA (US); Wael Zohni, San Jose, CA (US); Liang Wang, Milpitas, CA (US); Akash Agrawal, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/334,606

(22) Filed: Oct. 26, 2016

(65) Prior Publication Data

US 2018/0114747 A1   Apr. 26, 2018

(51) Int. Cl.
*H01L 23/498* (2006.01)
*H01L 21/48* (2006.01)
*H01L 23/00* (2006.01)

(52) U.S. Cl.
CPC ...... *H01L 23/49833* (2013.01); *H01L 21/486* (2013.01); *H01L 21/4853* (2013.01); *H01L 21/4857* (2013.01); *H01L 23/49816* (2013.01); *H01L 23/49822* (2013.01); *H01L 23/49827* (2013.01); *H01L 23/49838* (2013.01); *H01L 23/49866* (2013.01); *H01L 23/562* (2013.01)

(58) Field of Classification Search
CPC .......... H05K 1/00; H05K 1/0298; H05K 1/09; H05K 1/11; H05K 1/16; H05K 3/02; H05K 3/10; H05K 3/38; H05K 3/4038; H01L 21/4853; H01L 21/4857; H01L 21/486; H01L 23/49816; H01L 23/49822; H01L 23/49827; H01L 23/49833; H01L 23/49838; H01L 23/49866; H01L 23/562
See application file for complete search history.

(56) References Cited

U.S. PATENT DOCUMENTS

| | | | | |
|---|---|---|---|---|
| 5,232,548 A | * | 8/1993 | Ehrenberg | H05K 3/462 216/18 |
| 5,436,062 A | * | 7/1995 | Schmidt | H05K 1/115 174/254 |
| 6,175,087 B1 | * | 1/2001 | Keesler | H05K 3/429 174/261 |
| 6,376,052 B1 | * | 4/2002 | Asai | H05K 3/0094 174/255 |

(Continued)

FOREIGN PATENT DOCUMENTS

JP    08-2559870 A    10/1996

OTHER PUBLICATIONS

"Package Substrates/Interposers," internet address: http://eesemi.com/substrates.htm; [downloaded from internet on Feb. 9, 2017], 2 pages.

(Continued)

*Primary Examiner* — Carl J Arbes

(57) ABSTRACT

A microelectronic assembly including first and second laminated microelectronic elements is provided. A patterned bonding layer is disposed on a face of each of the first and second laminated microelectronic elements. The patterned bonding layers are mechanically and electrically bonded to form the microelectronic assembly.

10 Claims, 9 Drawing Sheets

(56) References Cited

U.S. PATENT DOCUMENTS

| | | | |
|---|---|---|---|
| 6,591,495 B2 * | 7/2003 | Hirose | H05K 3/0035 174/264 |
| 7,129,158 B2 * | 10/2006 | Nakai | C23C 18/54 257/678 |
| 7,346,982 B2 | 3/2008 | Kim et al. | |
| 7,415,761 B2 * | 8/2008 | Hirose | H05K 3/0035 216/35 |
| 8,110,750 B2 * | 2/2012 | Inagaki | H01L 21/4857 174/260 |
| 8,405,196 B2 | 3/2013 | Haba et al. | |
| 8,491,739 B2 | 7/2013 | Germann | |
| 8,580,066 B2 | 11/2013 | Yamada et al. | |
| 8,610,001 B2 | 12/2013 | Kato | |
| 8,709,913 B2 | 4/2014 | Oganesian et al. | |
| 8,742,553 B2 | 6/2014 | Ishida et al. | |
| 8,791,575 B2 | 7/2014 | Oganesian et al. | |
| 8,796,135 B2 | 8/2014 | Oganesian et al. | |
| 8,829,355 B2 | 9/2014 | Kariya et al. | |
| 8,945,329 B2 | 2/2015 | Yajima | |
| 9,048,229 B2 | 6/2015 | Ishida et al. | |
| 9,185,799 B2 | 11/2015 | Ishida et al. | |
| 9,204,552 B2 | 12/2015 | Furutani et al. | |
| 9,232,638 B2 | 1/2016 | Kato et al. | |
| 9,497,849 B2 | 11/2016 | Kariya et al. | |
| 9,554,462 B2 | 1/2017 | Kitagawa | |
| 2005/0039948 A1 * | 2/2005 | Asai | H05K 3/387 174/262 |
| 2006/0012967 A1 * | 1/2006 | Asai | G02B 6/43 361/764 |
| 2009/0016671 A1 * | 1/2009 | Asai | G02B 6/43 385/14 |
| 2009/0053459 A1 * | 2/2009 | Hirose | H01L 23/49811 428/76 |
| 2009/0283302 A1 | 11/2009 | Lee et al. | |
| 2011/0303444 A1 | 12/2011 | Yoshimura | |
| 2011/0303453 A1 | 12/2011 | Yoshimura et al. | |
| 2013/0048355 A1 | 2/2013 | Furuta et al. | |
| 2013/0063918 A1 | 3/2013 | Haba et al. | |
| 2013/0221068 A1 | 8/2013 | Germann et al. | |
| 2014/0311772 A1 | 10/2014 | Mizutani et al. | |
| 2015/0245474 A1 | 8/2015 | Takahashi et al. | |
| 2015/0257268 A1 | 9/2015 | Kitagawa et al. | |
| 2015/0340309 A1 | 11/2015 | Furutani et al. | |

OTHER PUBLICATIONS

"Solders melting at >260° C." (Para. 3 on p. 2), Indium Corp., internet address: http://www.indium.com/solder-paste-and-powders/low-high-temperature/; [downloaded from Internet on Feb. 9, 2017], 4 pages.

International Search Report and Written Opinion for PCT Application No. PCT/US2017/056067, dated Jan. 31, 2018, 15 pages.

\* cited by examiner

BONDING OF LAMINATES WITH ELECTRICAL INTERCONNECTS

FIELD

The following description relates to laminated substrate bonding, and in particular, the bonding of at least two laminated substrates together, which may be accompanied by simultaneously electrically interconnecting such substrates.

BACKGROUND

The demand for more compact physical arrangements of microelectronic devices such as integrated chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full interne connectivity, entertainment including full-resolution video, navigation, electronic banking and more, all in a pocket-size device. Complex portable devices require packing numerous chips into a small space.

Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly.

One solution includes the use of build-up substrates or interposers, which route signals between chips and other board mounted systems, and provide for the use of small chips, as well as allow for vertical stacking of chips to maximize space efficiency. Various techniques can be used to form build-up microelectronic assemblies, which include a core, and have multiple built-up routing layers on either side of the core, with electrical interconnections between the layers. However, build-up substrates can be very expensive and are generally low yielding (sold as singulated units). In most cases, build-up substrates have few layers that can actually be used for routing, even if the substrate includes more layers. For instance, in some cases, 80-95% of the routing occurs above the core of the build-up substrate. Further, the thick cores common to build-up substrates can have negative system integration implications. For instance, it can be difficult to transmit high-frequency signals (e.g., 28 Gbps and above) due to large vias through the cores. This can limit the application of the build-up substrates.

Another challenge of multi-layer processing is to achieve a sufficiently planar interface between the layers of the build-up substrate and to make reliable electrical interconnections between contacts on respective layers.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
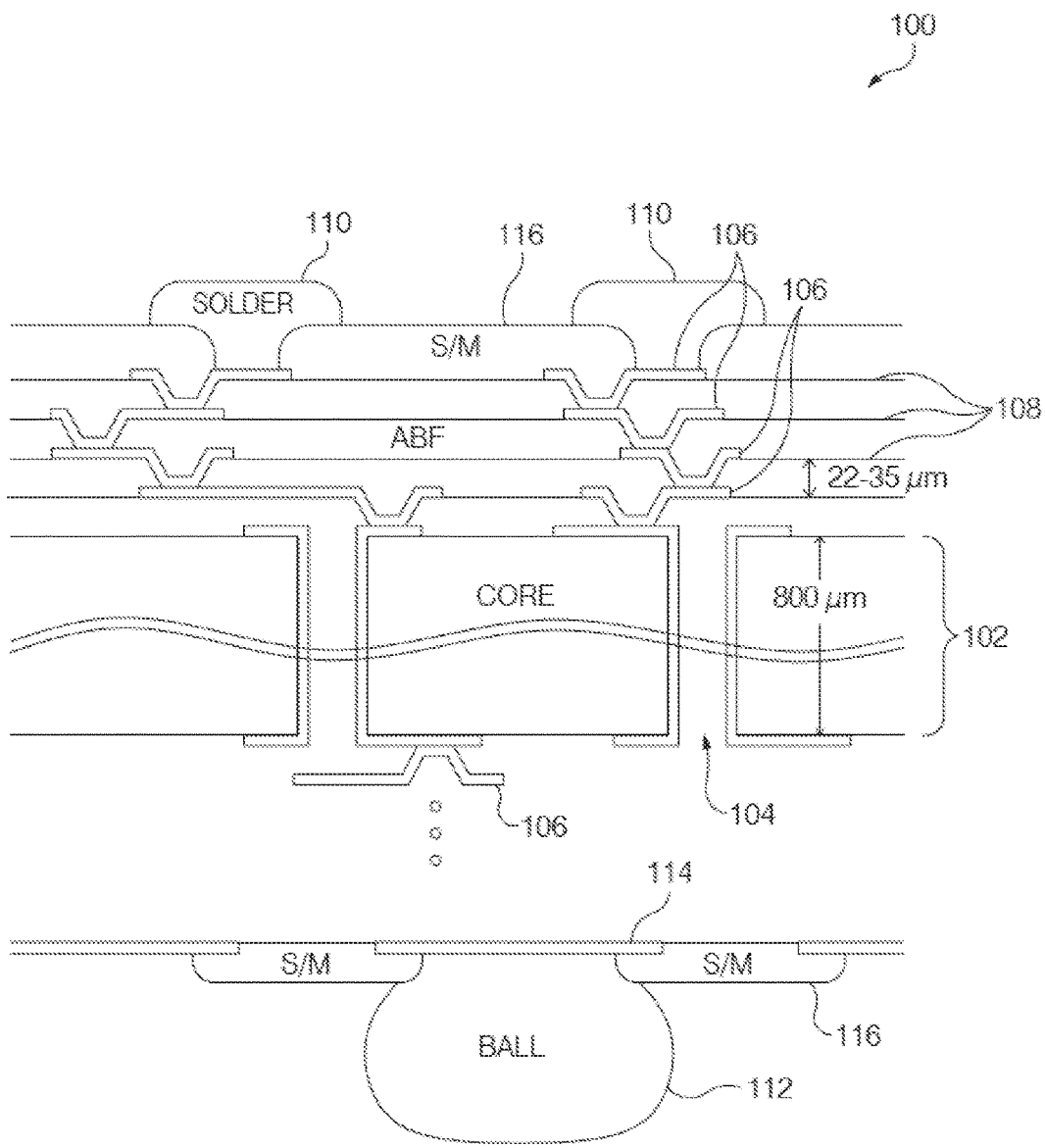
FIG. 1 is a cut-away profile view illustrating a multi-layer build-up substrate.

A microelectronic assembly including first and second laminated microelectronic elements is provided. Each of the laminated microelectronic elements includes a plurality of element contacts (e.g., terminals) on a face of the element. A patterned bonding layer is disposed on the face of each of the first and second elements, where each patterned bonding layer includes a plurality of conductive bonding portions. The patterned bonding layers are mechanically and electrically bonded, with the faces of the first and second laminated microelectronic elements facing each other, to form the microelectronic assembly. The conductive bonding portions at each face bond to form electrical interconnections between the first and second laminated microelectronic elements. In various aspects, the microelectronic assembly comprises a bonded laminate substrate.

In various implementations, the first laminated microelectronic element and the second laminated microelectronic element each comprise a multi-layer substrate. For example, each of the multi-layer substrates includes a rigid core with one or more vias disposed through the core, and one or more conductive routing layers, separated by layers of insulating material, coupled to each side (i.e., surface) of the core.

In different embodiments, different quantities of conductive routing layers may be used (in various positions within each laminated microelectronic element) to control warpage of the microelectronic assembly. One aspect of the disclosure provides an unequal quantity of routing layers at either side of the core, at both the first and second laminated microelectronic elements. In one example, this arrangement results in a balanced bonded microelectronic assembly (in terms of the quantities of layers on either side of the patterned bonding layers). In other examples, the bonded microelectronic assembly is unbalanced, as desired for warpage control.

Another aspect of the disclosure provides an equal quantity of routing layers at either side of the core, at both the first and second laminated microelectronic elements. However, in one example, the quantity of routing layers at either side of the core of the first laminated microelectronic element is not equal to the quantity of routing layers at either side of the core of the second laminated microelectronic element. This arrangement results in an unbalanced bonded microelectronic assembly.

In an embodiment, the quantities of layers at the various positions with respect to each of the cores is based on the coefficients of thermal expansion (CTE) of the materials selected for the various portions of the bonded microelectronic assembly, including the conductive routing layers and the insulating materials.

In another embodiment, each of the patterned bonding layers of the microelectronic assembly includes a conductive sealing portion surrounding the conductive bonding portions. In the embodiment, the bonding of the conductive sealing portions forms a contiguous and self-sealing perimeter weld around the interconnections formed by the bonded conductive bonding portions.

Various implementations and arrangements are discussed with reference to electrical and electronics components and varied carriers. While specific components (i.e., integrated circuit (IC) chips, wafers, substrates, printed circuit boards (PCB), discrete components, etc.) are mentioned, this is not intended to be limiting, and is for ease of discussion and illustrative convenience. The techniques and devices discussed are applicable to any type or number of packages, packaged circuits or components, circuits (e.g., integrated circuits (IC), mixed circuits, ASICS, memory devices, processors, etc.), electrical components or groups of components, carrier structures (e.g., wafers, substrates, panels, boards, PCBs, etc.), and the like. Each of these components, circuits, chips, structures, and the like, can be generically referred to as a "microelectronic element." Further, references to a specific component are also applicable to other types of microelectronic elements, unless specified.

Implementations are explained in more detail below using a plurality of examples. Although various implementations and examples are discussed here and below, further implementations and examples may be possible by combining the features and elements of individual implementations and examples.

Example Build-up Substrates

Figure 2:
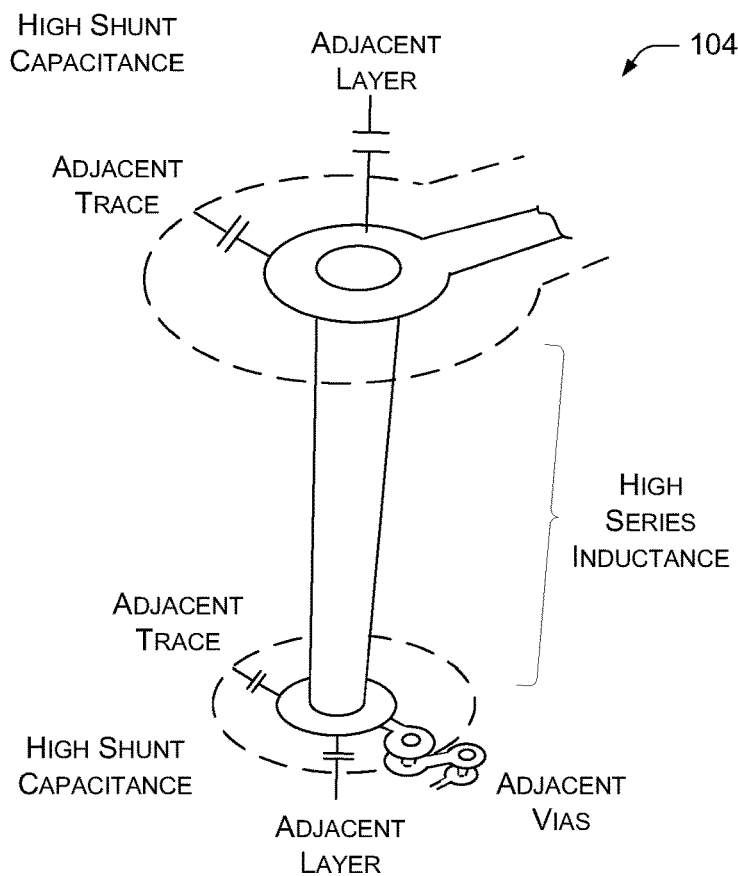
FIG. 2 is a representation of series inductance and shunt capacitance of an example large-core via.

FIG. 1 illustrates an example multi-layer build-up substrate 100. The core 102 is generally 400, 800, or 1000 microns (um) thick. Some larger packages can have thicker cores 102. Metal plated vias 104 that extend through the core 102 can have a pitch of approximately 350 um. As illustrated in FIG. 2, vias 104 of this size are effectively large low-pass filters, having a large series inductance (from one surface of the core 102 to an opposite surface of the core 102) and a large shunt capacitance (from the via 104 plating to nearby conductive traces on a same layer and from the via 104 plating to conductive portions of traces on adjacent layers). The impedance of the via 104 has a negative effect on high-frequency signal transmission (such as approximately 28 Gbps and above), limiting possible applications of the substrate 100.

Multiple conductive routing layers 106 separated by layers of insulating material 108 are disposed on either side (e.g., surface) of the core 102. Often, the insulating materials used (build-up film, for example) have very large coefficients of thermal expansion (CTE), larger than the core 102 or other possible insulators (such as prepreg, for example). The large CTEs can create difficulties in controlling warpage of the substrate 100 at some temperatures.

In various examples, the substrate 100 also includes solder (or other conductive material) contacts 110 at one exterior surface, and solder balls 112 (or the like) on pads 114 at the opposite exterior surface. Solder mask 114 or other insulating material may be used to isolate interconnect terminals from each other.

Based on the electrical characteristics of the substrate 100, which are due to its physical design, a substrate 100 with a total of 12 layers (5-2-5) may have only 2 to 3 useable high-density routing layers, for example.

Figure 3:
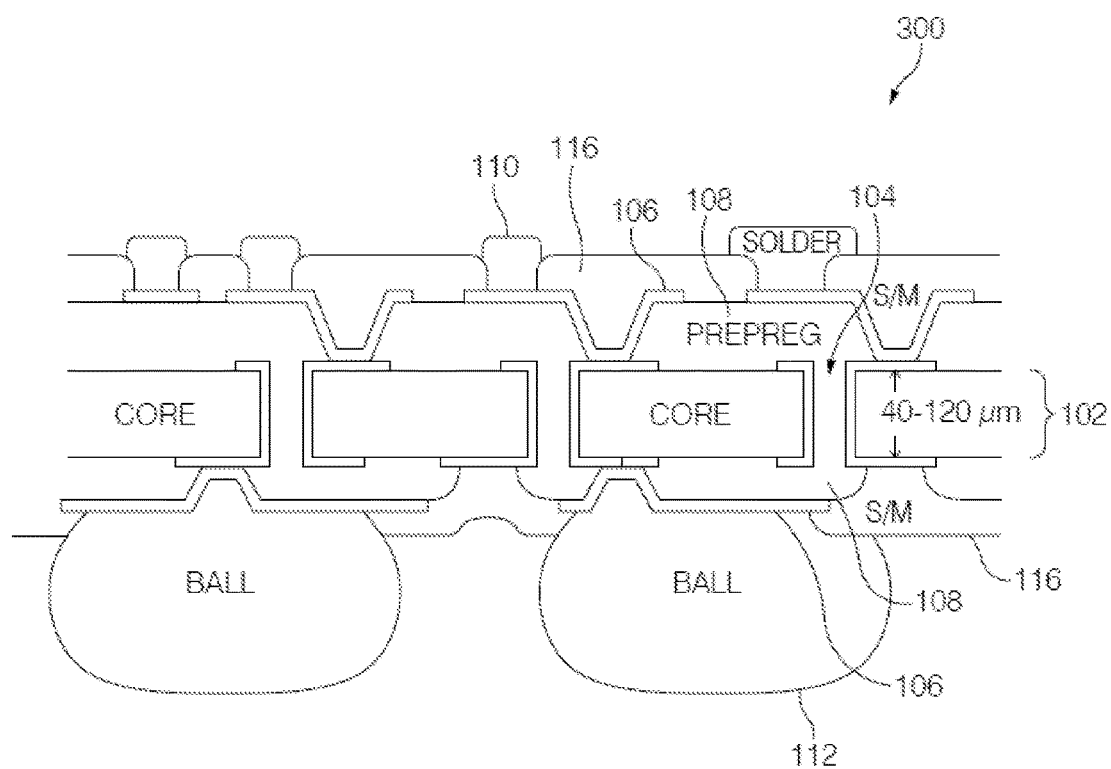
FIG. 3 is a cut-away profile view illustrating another multi-layer build-up substrate, having fewer layers.

FIG. 3 illustrates another example multi-layer build-up substrate 300, with a thinner core 102 (approximately 40 to 120 um thick) and fewer routing layers 106 (2 to 4 routing layers total). The design rules of the thinner core 102 substrate 300 means smaller vias 104 through the core 102, which reduces the high-frequency bottleneck through the core 102. The prepreg insulating material 108 between the routing layers 106 tends to be comparable to the core 102 in thickness. In other examples, other insulating materials 108 may be used.

In various examples, the substrate 300 tends to be much less expensive in 2-layer and 4-layer (total routing layers) configurations than the substrate 100.

Example Bonded Laminate Substrate

Figure 4:
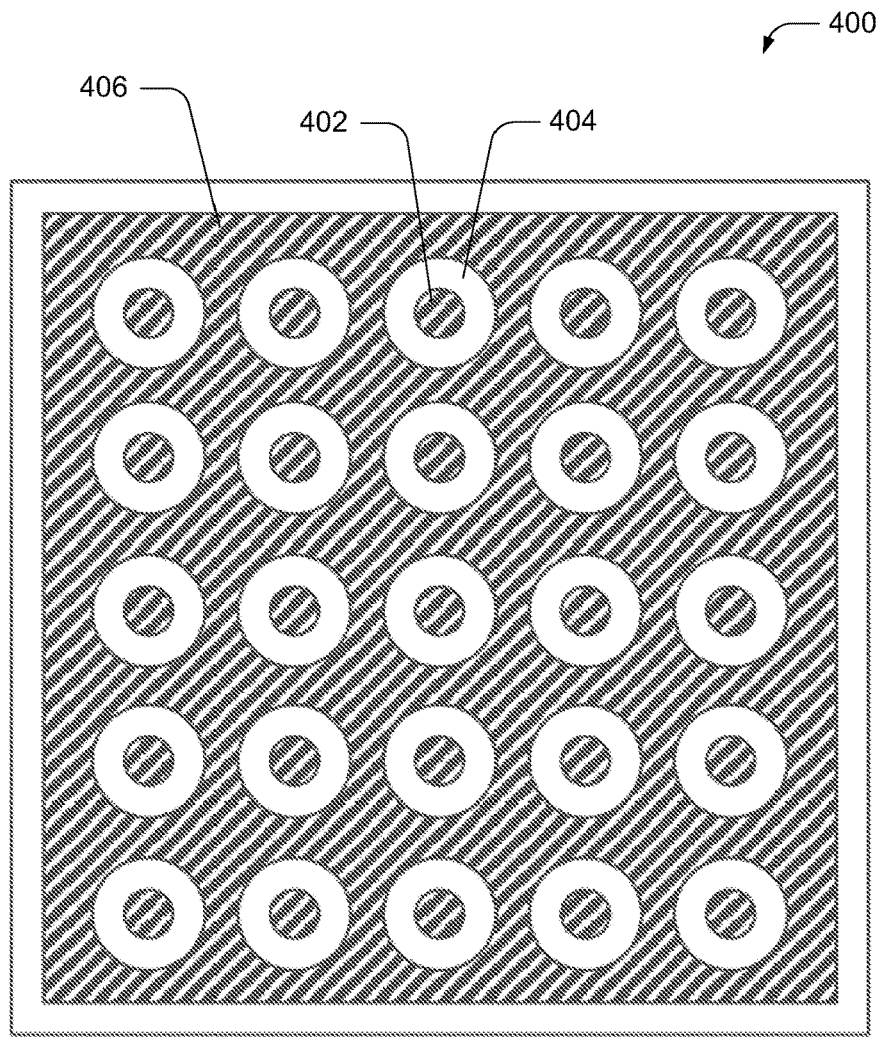
FIG. 4 is an illustration of an example patterned bonding layer, according to an embodiment.

FIG. 4 is an illustration of an example patterned bonding layer 400, according to an embodiment. The patterned bonding layer 400 includes conductive bonding portions 402 which are isolated from each other by air gaps or other insulating material, e.g., film, 404. In an embodiment, as shown in FIG. 4, the patterned bonding layer 400 also includes a conductive sealing portion 406 surrounding the plurality of conductive bonding portions 402. In various examples, the conductive portions 402 and 406 of the patterned bonding layer 400 are comprised of one or more metallic materials such as tin, copper, porous nickel, or the like, or combinations of the same. In alternate examples, the conductive portions 402 and 406 are comprised of a non-metallic conductive or semi-conductive material.

Figure 5:
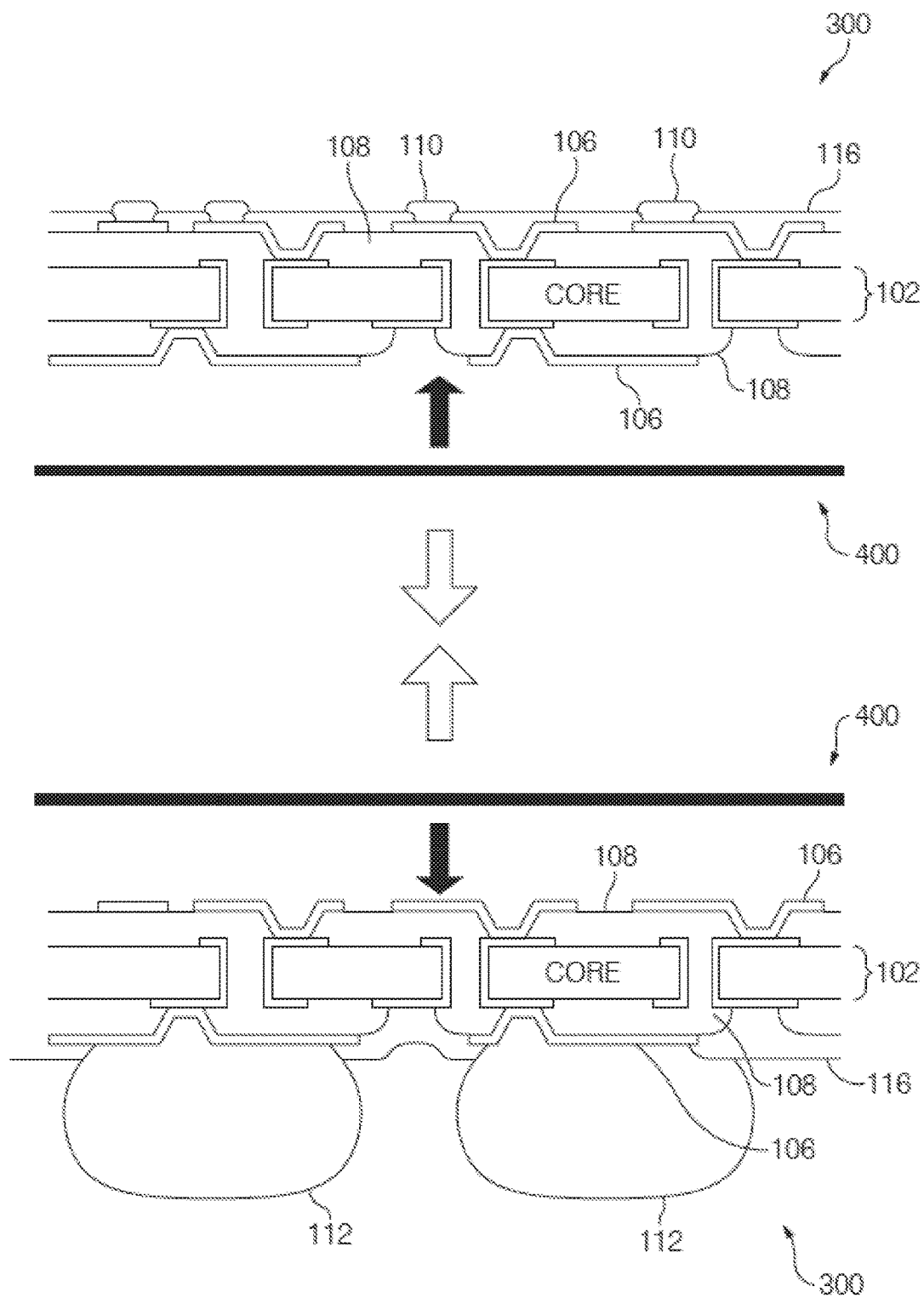
FIG. 5 is an illustration showing bonding of two laminates using patterned bonding layers, according to an embodiment.

In various implementations, a patterned bonding layer 400 is disposed (e.g., coupled, attached, plated, deposited, formed, etc.) at one face each of two separate substrates 300 (microelectronic elements). For example, as illustrated in FIG. 5, the substrates 300 may be arranged to face each other for bonding, and the faces of the substrates 300 to be bonded may have a routing layer 106 exposed, conductive terminals, or the like (i.e., element contacts). A bonding layer 400 is applied to the faces to be bonded such that the conductive bonding portions 402 are electrically coupled to the element contacts (i.e., the exposed routing layers 106, etc.). If included, the conductive sealing portion 406 surrounds the conductive bonding portions 402 on the face of the substrate 300. In an alternative embodiment, a single patterned bonding layer 400 is used to bond both substrates 300 together. In the embodiment, the bonding layer 400 is disposed on one of the two substrates 300, at a face of the substrate 300 to be bonded.

As illustrated in FIG. 5, the substrates 300 are bonded together, including bonding the patterned bonding layers 400 mechanically and electrically to each other. The conductive bonding portions 402 of each of the patterned bonding layers 400 are coupled to each other, forming interconnections between element contacts of the first substrate 300 (top) and element contacts of the second substrate 300 (bottom). Accordingly, the interconnections between the element contacts of the two substrates 300, formed by the bonded conductive bonding portions 402 of the patterned bonding layers 400, electrically couples the terminals 110 of the first substrate 300 to the ball 112 grid of the second substrate 300, via the routing layers 106 of the substrates 300.

In an implementation, the conductive sealing portions 406 surrounding the conductive bonding portions 402 are also bonded together, and form a self-sealing bonded weld around the periphery of the bonded substrates 300. In some examples, a poly seal may be added to the periphery to further seal the bond.

Figure 6:
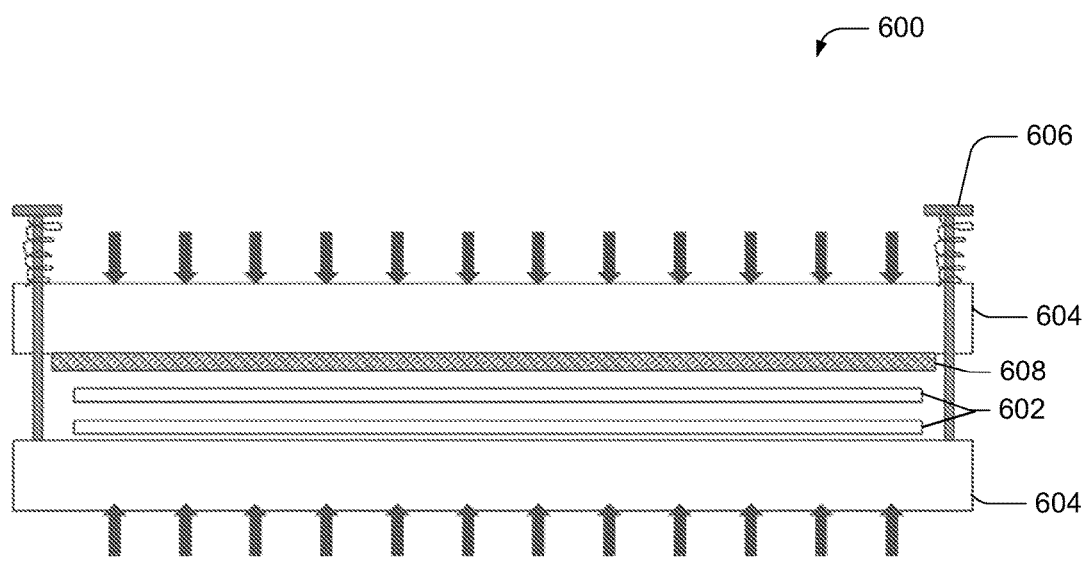
FIG. 6 shows an example mechanism for bonding laminated substrates, according to an embodiment.

In some implementations, the substrates 300 and patterned bonding layers 400 are bonded using a thermo-compression technique, at the panel level. For example, a board clamp 600, such as illustrated in FIG. 6 may be used. The panels 602, which include the substrates 300 with the patterned bonding layers 400 applied to them (e.g., plated, etc.), are loaded into the clamp 600, which includes board clamp halves 604, which are rigid structures that may be aligned using spring pins 606, for example. The clamp halves 604 may have a low thermal mass (i.e., comprise a composite, etc.).

To allow for variances in the surface profiles of the panels 602, an elastomer 608 can be placed between the panels 602 and one or both of the board clamp halves 604. For instance, the panels 602 may be placed in the clamp 600 "bottom up," so that the balls 112 are at the top of the panels 602, and the elastomer 608 may be used on the top clamp half 604 to allow for the uneven surface at the top due to the balls 112.

In some examples, the clamp 600 comprises a hydro-press. The panels 602 may be run through a heated reflow process, a variable pressure oven, or the like, or a combination of the same to bond the panels 602 together as desired. In an alternate implementation, an electrolysis technique or another technique may be used for bonding the panels 602.

Figure 7:
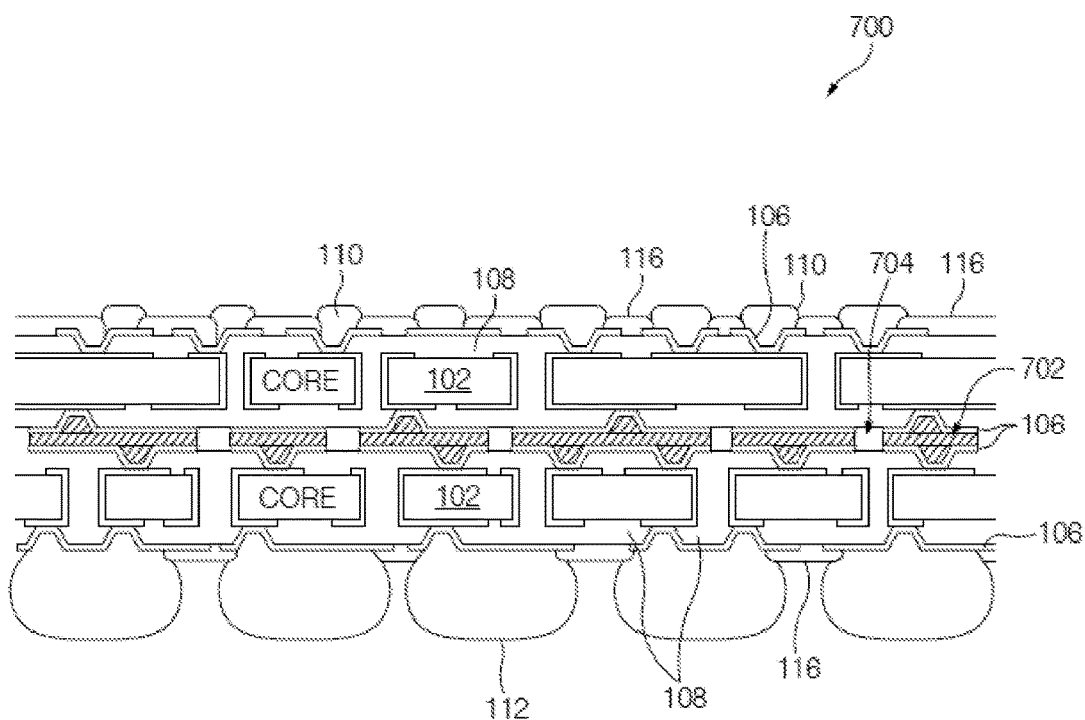
FIG. 7 is a profile view cut-away illustration of an example bonded laminate substrate, according to an embodiment.

Referring to FIG. 7, an example bonded laminate substrate 700 is illustrated. The patterned bonding layers 400 are bonded together to form patterned bonding layer 702 (or a single patterned bonding layer 400 forms the patterned bonding layer 702 during the bonding process). Bonding layer 702 interconnects element contacts (such as portions of the routing layers 106) of the bonded substrates 300 to provide electrical continuity through the signal paths of the bonded laminate interposer substrate 700. In some cases, the bonding layer 702 includes trapped gas or voids 704 from the bonding process. However, the trapped gas is generally non-corrosive, such as nitrogen gas.

In various embodiments, bonding two 2-layer substrates 300 results in a bonded laminated substrate 700 with 2 to 3 usable high-speed, high-density routing layers. High density and high speeds are available due to the elimination of the large core vias 104 of the substrate 100. Accordingly, the bonded laminate interposer substrate 700 has reduced series inductance and reduced shunt capacitance (smaller capture pads on the vias 104). In many cases, 2-layer and 4-layer substrates 300 are widely available, which has a positive impact on the cost of the bonded laminated substrate 700.

Figure 8:
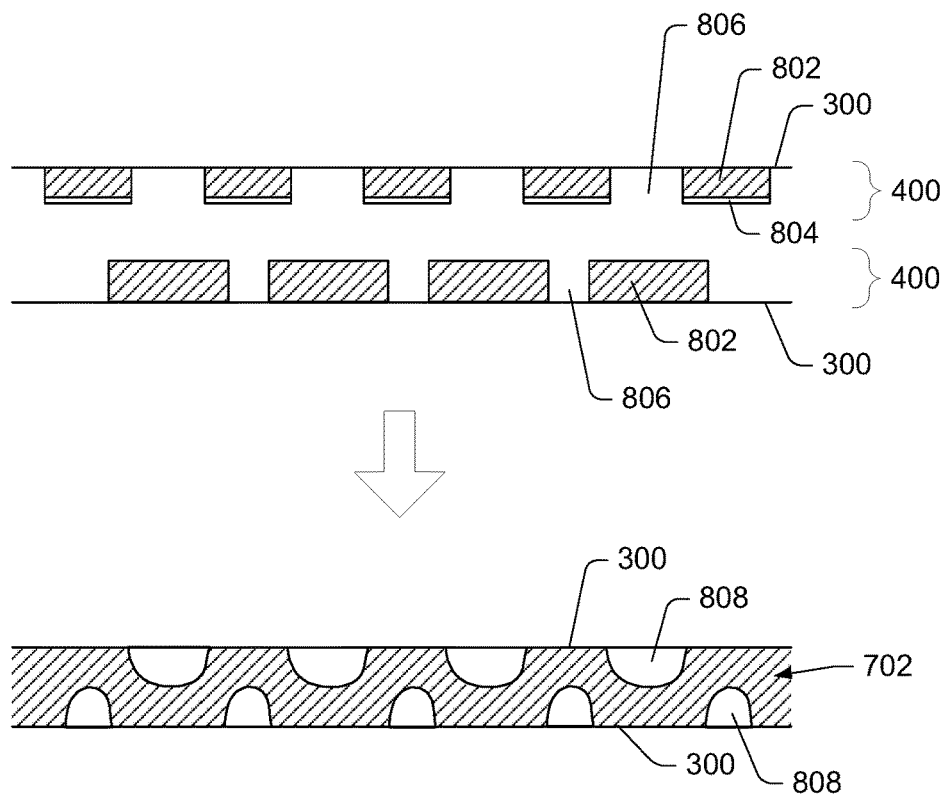
FIG. 8 is an illustration showing an example bonding of staggered bonding layers, according to an embodiment.

Referring to FIG. 8, in some cases, larger areas of metal fill can be reduced on the patterned bonding layers 400. For example, the metallic plating 802 and 804 (one or more conductive materials) on one or both substrates 300 can include some spaces or holes 806, to reduce material. As the metallic plating is applied, the spaces 806 can be staggered, so that they overlap when the patterned bonding layers 400 are bonded together. The remaining holes 808 due to the overlap are small, and allow space for metal to flow during heated reflow, for example. In some cases, the reduced plating 802, 804 with spaces 806 and resulting holes 808 can allow for more flexibility for warpage.

In alternate embodiments, multi-layer coreless substrates (not shown) may also be bonded together or bonded with conventional substrates 300 to form a bonded laminate substrate 700. Other alternate embodiments include die to ceramic bonds, laminate to ceramic bonds, die to laminate bonds, and the like. An organic interposer on a sacrificial layer bonded to a substrate 300, and an organic interposer bonded to a substrate 300 are also within the scope of the disclosure.

Additionally, metals used for the patterned bonding layer 400, and the conductive materials 802 and 804 may include materials that have a lower melting point when plating on the substrates 300, but that form a metallic with a higher melting point (e.g., higher than the reflow temperature, etc.) after thermo-compression bonding. Some examples include copper-tin alloys, copper-tin-nickel alloys, copper-tin-palladium alloys, indium-based alloys, gold-based alloys, and the like. In other alternate embodiments, polymers such as anisotropic conducting adhesives with z-axis conducting properties, for example, may be used as conductive materials for one or more of the patterned bonding layer 400 and the conductive materials 802 and 804.

In one alternate example, opposing portions of v-joints (not shown) may be formed on opposite patterned bonding layers 400. The opposing v-joint portions interlock to form bonds during compression of the patterned bonding layers 400. In other embodiments, other interlocking shapes may also be used to form locking bonds. Further, the described joining may be performed at least in part at the wafer level, as described in U.S. Pat. No. 8,709,913, which is herein incorporated in its entirety.

Unless otherwise specified, alternative components to those specifically mentioned may be used to implement the techniques described herein. In various implementations, the techniques described herein may be applied to stacks or groups of stacks of microelectronic components 300, or the like.

Example Process

Figure 9:
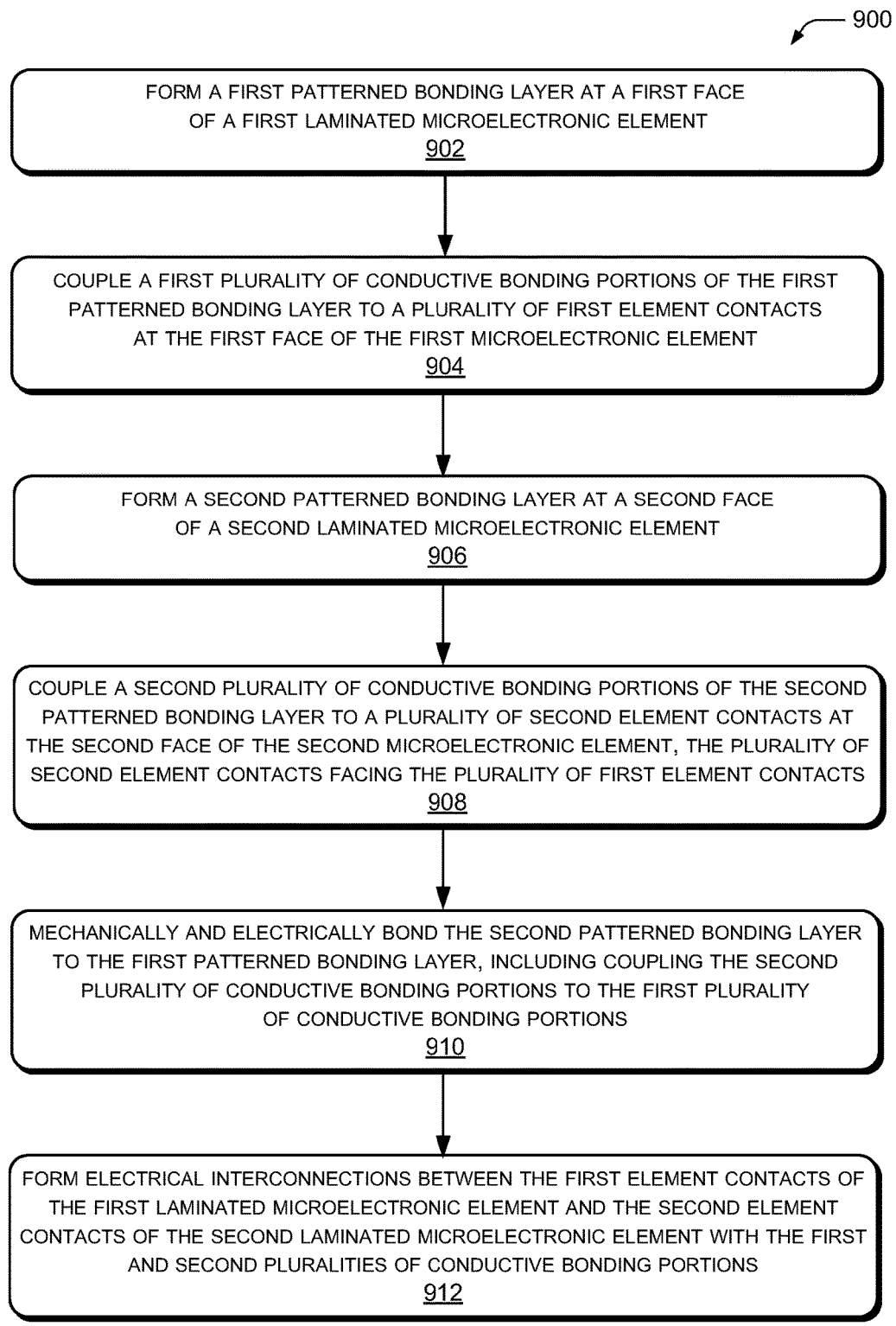
FIG. 9 is a flow diagram illustrating example process steps for forming a bonded laminate substrate, according to an example embodiment.

FIG. 9 is a flow diagram illustrating an example process 900 for forming a microelectronic assembly 700 comprising a bonded laminate substrate, including a pair of laminated substrates 300 (microelectronic elements 300) bonded using one or more patterned bonding layers 400, according to various implementations. The use of the flow diagram of FIG. 9 to illustrate the process described is an example that is not intended to be limiting. Further, FIGS. 1-8 and their respective discussions also illustrate example processes for forming a microelectronic assembly 700 and the component parts. Any of the processes described with respect to FIGS. 1-8 may also describe a corresponding apparatus, structure, system, or the like. The blocks of FIG. 9 have reference to the arrangements shown at FIGS. 1-8.

Referring to FIG. 9, at 902, the process includes forming a first patterned bonding layer (such as patterned bonding layer 400, for example), including a plurality of conductive bonding portions (such as conductive bonding portions 402, for example), at a first face of a first laminated microelectronic element. In various embodiments, the patterned bonding layer is formed by plating, deposition, coupling, forming, attaching, etc. the patterned bonding layer to the face of the first laminated microelectronic element. In an implementation, the process includes electrically isolating one or more of the first conductive bonding portions from others of the first conductive bonding portions, using an air gap, an insulating material, or the like.

In an alternate implementation, the process includes staggering a placement of conductive material, with spaces or holes in the material, for the first plurality of conductive bonding portions, to improve a warpage tolerance of the first patterned bonding layer.

At 904, the process includes coupling the first plurality of conductive bonding portions of the first patterned bonding layer to a plurality of first element contacts (e.g., conductive portions of routing layers 106, for example) at the first face of the first microelectronic element.

At 906, the process includes forming a second patterned bonding layer at a second face of a second laminated microelectronic element, as described above with reference to the first patterned bonding layer. In an implementation, the process includes forming a second plurality of conductive bonding portions with the second patterned bonding layer and electrically isolating one or more of the second conductive bonding portions from others of the second conductive bonding portions as well.

In an alternate implementation, the process includes staggering a placement of conductive material, with spaces or holes in the material, for the second plurality of conductive bonding portions, as above.

At 908, the process includes coupling the second plurality of conductive bonding portions of the second patterned bonding layer to a plurality of second element contacts (e.g., conductive portions of routing layers 106, for example) at the second face of the second microelectronic element, where the plurality of second element contacts face the plurality of first element contacts.

At 910, the process includes mechanically and electrically bonding the second patterned bonding layer to the first patterned bonding layer, including coupling the second plurality of conductive bonding portions to the first plurality of conductive bonding portions. In an implementation, the process includes mechanically and electrically bonding the second patterned bonding layer to the first patterned bonding layer by thermally compressing the second laminated microelectronic element to the first laminated microelectronic element to form a bonded laminate substrate. In an embodiment, the process includes subjecting the bonded laminate substrate to an additional bonding process, including a heated reflow process or a variable pressure oven process.

At 912, the process includes forming electrical interconnections between the first element contacts of the first laminated microelectronic element and the second element contacts of the second laminated microelectronic element with the first and second pluralities of conductive bonding portions.

In an implementation, the process includes forming a first conductive sealing portion surrounding the first plurality of conductive bonding portions at the first face of the first laminated microelectronic element and forming a second conductive sealing portion surrounding the second plurality of conductive bonding portions at the second face of the second laminated microelectronic element and mechanically and electrically bonding the second conductive sealing portion to the first conductive sealing portion. In an embodiment, the first and second conductive sealing portions are part of the first and second patterned bonding layers.

In an implementation, the process includes forming one or more terminal connections (such as contacts 110, for example) at a third face (e.g., the top) of the first laminated microelectronic element and forming one or more interconnections (such as solder balls 112, for example) at a fourth face (e.g., the bottom) of the second laminated microelectronic element. In the implementation, the one or more terminal connections have electrical connectivity to the one or more interconnections due to the first and second patterned bonding layers (e.g., the first and second conductive bonding portions, etc.).

In an implementation, the process includes forming (or acquiring) the first laminated microelectronic element and the second laminated microelectronic element (top and bottom substrates 300, respectively). In the process, each includes forming one or more vias through a rigid core having a first surface and a second surface, the one or more vias adapted to carry an electrical signal between the first and second surfaces. One or more first conductive routing layers are formed at the first surface of the rigid core. Each first conductive routing layer is separated by an insulating layer. One or more second conductive routing layers are formed at the second surface of the rigid core. Each second conductive routing layer separated by an insulating layer. The process includes electrically coupling the one or more first and second conductive routing layers to the one or more vias.

In an implementation, the process includes controlling a warpage of the microelectronic assembly (700) by selecting a quantity of the first and second conductive routing layers of the first laminated microelectronic element and selecting a quantity of the first and second conductive routing layers of the second laminated microelectronic element. In an implementation, the process includes controlling the warpage of the microelectronic assembly by selecting an unequal quantity of first and second conductive routing layers of the first laminated microelectronic element and selecting an unequal quantity of first and second conductive routing layers of the second laminated microelectronic element. In another implementation, the process includes controlling the warpage of the microelectronic assembly by selecting a first equal quantity of first and second conductive routing layers of the first laminated microelectronic element and selecting a second equal quantity of first and second conductive routing layers of the second laminated microelectronic element. In an embodiment, the first equal quantity and the second equal quantity are different quantities.

In an implementation, the process includes controlling the warpage of the microelectronic assembly by determining a quantity of first and second conductive routing layers of the first laminated microelectronic element and determining a quantity of first and second conductive routing layers of the second laminated microelectronic element. The determining is based on a coefficient of thermal expansion (CTE) of conductive materials of the first and second conductive routing layers of the first laminated microelectronic element and the first and second conductive routing layers of the second laminated microelectronic element and a CTE of insulating materials of the insulating layers separating the first and second conductive routing layers of the first laminated microelectronic element and of the insulating layers separating the first and second conductive routing layers of the second laminated microelectronic element.

In an implementation, the process includes controlling the warpage of the microelectronic assembly by selecting conductive materials for the first and second conductive routing layers of the first laminated microelectronic element and the first and second conductive routing layers of the second laminated microelectronic element, and selecting insulating materials for the insulating layers separating the first and second conductive routing layers of the first laminated microelectronic element and the insulating layers separating the first and second conductive routing layers of the second laminated microelectronic element, based on a coefficient of thermal expansion (CTE) of the conductive materials and the insulating materials.

In another implementation, the process includes controlling the warpage of the microelectronic assembly by selecting quantities of substrate layers and materials for the substrate layers such that at high temperature one substrate dominates and keeps the microelectronic assembly structure flat. At low temperature the other substrate dominates and keeps the warpage low. The different material's rate of change of thermal expansion (Tg) will also define the overall structure warpage.

Different configurations of a microelectronic assembly 700 or a microelectronic element 300 other than those illustrated or discussed may be possible with different implementations, and are within the scope of the disclosure. The variations may have fewer elements than illustrated in the examples shown in FIGS. 1-9, or they may have more or alternative elements than those shown.

The order in which the processes are described herein is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable materials, or combinations thereof, without departing from the scope of the subject matter described herein. In alternate implementations, other techniques may be included in the processes in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A method of forming a microelectronic assembly, comprising:
   forming a first patterned bonding layer at a first face of a first laminated multilayer microelectronic element, the first laminated multilayer microelectronic element comprising a plurality of alternating conductive and insulating layers disposed on opposite surfaces of a core layer;
   coupling a first plurality of conductive bonding portions of the first patterned bonding layer to a plurality of first element contacts at the first face of the first laminated multilayer microelectronic element;
   forming a second patterned bonding layer at a second face of a second laminated multilayer microelectronic element, the second laminated multilayer microelectronic element comprising another plurality of alternating conductive and insulating layers disposed on opposite surfaces of a core layer;
   coupling a second plurality of conductive bonding portions of the second patterned bonding layer to a plurality of second element contacts at the second face of the second laminated multilayer microelectronic element, the plurality of second element contacts facing the plurality of first element contacts;
   mechanically and electrically bonding the second patterned bonding layer to the first patterned bonding layer, including coupling the second plurality of conductive bonding portions to the first plurality of conductive bonding portions; and
   forming electrical interconnections between the first element contacts of the first laminated multilayer microelectronic element and the second element contacts of the second laminated multilayer microelectronic element with the first and second pluralities of conductive bonding portions.

2. The method of claim 1, further comprising forming a first conductive sealing portion surrounding the first plurality of conductive bonding portions at the first face of the first laminated multilayer microelectronic element and forming a second conductive sealing portion surrounding the second plurality of conductive bonding portions at the second face of the second laminated multilayer microelectronic element and mechanically and electrically bonding the second conductive sealing portion to the first conductive sealing portion.

3. The method of claim 1, further comprising forming one or more terminal connections at a third face of the first laminated multilayer microelectronic element and forming one or more interconnections at a fourth face of the second laminated multilayer microelectronic element, the one or more terminal connections having electrical connectivity to the one or more interconnections due to the first and second patterned bonding layers.

4. The method of claim 1, further comprising staggering a placement of conductive material for the first plurality of conductive bonding portions and the second plurality of conductive bonding portions to improve a warpage tolerance of the first and second patterned bonding layers.

5. The method of claim 1, further comprising mechanically and electrically bonding the second patterned bonding layer to the first patterned bonding layer by thermally compressing the second laminated multilayer microelectronic element to the first laminated multilayer microelectronic element to form a bonded laminate substrate.

6. The method of claim 5, further comprising subjecting the bonded laminate substrate to an additional bonding process, including a heated reflow process or a variable pressure oven process.

7. The method of claim 1, further comprising forming the first laminated multilayer microelectronic element and the second laminated multilayer microelectronic element, each including:
   forming one or more vias through a rigid core having a first surface and a second surface, the one or more vias adapted to carry an electrical signal between the first and second surfaces;
   forming one or more first conductive routing layers, each first conductive routing layer separated by an insulating layer, at the first surface of the rigid core;

forming one or more second conductive routing layers, each second conductive routing layer separated by an insulating layer, at the second surface of the rigid core; and electrically coupling the one or more first and second conductive routing layers to the one or more vias.

8. The method of claim 7, further comprising controlling a warpage of the microelectronic assembly by selecting a quantity of the first and second conductive routing layers of the first laminated multilayer microelectronic element and selecting a quantity of the first and second conductive routing layers of the second laminated multilayer microelectronic element.

9. The method of claim 8, further comprising controlling the warpage of the microelectronic assembly by determining a quantity of first and second conductive routing layers of the first laminated multilayer microelectronic element and determining a quantity of first and second conductive routing layers of the second laminated multilayer microelectronic element based on a coefficient of thermal expansion (CTE) of conductive materials of the first and second conductive routing layers of the first laminated multilayer microelectronic element and the first and second conductive routing layers of the second laminated multilayer microelectronic element and a CTE of insulating materials of the insulating layers separating the first and second conductive routing layers of the first laminated multilayer microelectronic element and of the insulating layers separating the first and second conductive routing layers of the second laminated multilayer microelectronic element.

10. The method of claim 8, further comprising controlling the warpage of the microelectronic assembly by selecting conductive materials for the first and second conductive routing layers of the first laminated multilayer microelectronic element and the first and second conductive routing layers of the second laminated multilayer microelectronic element, and selecting insulating materials for the insulating layers separating the first and second conductive routing layers of the first laminated multilayer microelectronic element and the insulating layers separating the first and second conductive routing layers of the second laminated multilayer microelectronic element, based on a coefficient of thermal expansion (CTE) of the conductive materials and the insulating materials.

* * * * *